(12) United States Patent
Kim et al.

(10) Patent No.: US 12,363,948 B2
(45) Date of Patent: Jul. 15, 2025

(54) FORMATION OF GATE ALL AROUND DEVICE

(71) Applicant: Applied Materials, Inc., Santa Clara, CA (US)

(72) Inventors: Myungsun Kim, Pleasanton, CA (US); Andy Lo, Saratoga, CA (US); Eric Davey, Mountain View, CA (US); Michael Stolfi, Clifton Park, NY (US); Benjamin Colombeau, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 404 days.

(21) Appl. No.: 17/498,098

(22) Filed: Oct. 11, 2021

(65) Prior Publication Data

US 2022/0123123 A1   Apr. 21, 2022

Related U.S. Application Data

(60) Provisional application No. 63/195,243, filed on Jun. 1, 2021, provisional application No. 63/093,829, filed on Oct. 20, 2020.

(51) Int. Cl.
*H10D 30/67* (2025.01)
*H01L 21/02* (2006.01)
(Continued)

(52) U.S. Cl.
CPC ..... *H10D 30/6735* (2025.01); *H01L 21/0206* (2013.01); *H01L 21/02164* (2013.01);
(Continued)

(58) Field of Classification Search
CPC ........... H01L 29/42392; H01L 21/0206; H01L 29/0665; H01L 29/66477; H01L 29/78696
See application file for complete search history.

(56) References Cited

U.S. PATENT DOCUMENTS 8,207,044 B2   6/2012   Mani et al.
10,243,061 B1   3/2019   Cheng et al.
(Continued)

FOREIGN PATENT DOCUMENTS

KR   100630764 B1   10/2006
TW   I619176 B   3/2018
(Continued)

OTHER PUBLICATIONS

Hellings, G., et al., "Si/SiGe superlattice I/O finFETs in a vertically-stacked Gate-All-Around horizontal Nanowire Technology", 2018 Symposium on VLSI Technology Digest of Technical Papers, downloaded May 27, 2021 from IEEE Xplore, two pages.
(Continued)

*Primary Examiner* — Brian Turner
(74) *Attorney, Agent, or Firm* — SERVILLA WHITNEY LLC (57) ABSTRACT

Horizontal gate-all-around devices and methods of manufacturing same are described. The hGAA devices comprise an oxide layer and a semiconductor material layer between source regions and drain regions of the device. The method includes growing a conformal epitaxial layer on a nanosheet channel layer, followed by radical plasma oxidation (RPO) to oxidize the conformal epitaxial layer. An alternative method includes growing a conformal epitaxial layer on a nanosheet channel layer, followed by a surface treatment, and then radical plasma oxidation (RPO) to oxidize the conformal epitaxial layer.

30 Claims, 8 Drawing Sheets

(51) Int. Cl.
  *H01L 21/306* (2006.01)
  *H01L 21/3065* (2006.01)
  *H10D 30/01* (2025.01)
  *H10D 62/10* (2025.01)

(52) U.S. Cl.
  CPC .. *H01L 21/02236* (2013.01); *H01L 21/30604* (2013.01); *H01L 21/3065* (2013.01); *H10D 30/021* (2025.01); *H10D 30/6757* (2025.01); *H10D 62/118* (2025.01)

(56) References Cited

U.S. PATENT DOCUMENTS

| | | | |
|---|---|---|---|
| 10,332,881 B1 | 6/2019 | Badaroglu et al. | |
| 10,700,064 B1 | 6/2020 | Zhang et al. | |
| 2004/0229414 A1* | 11/2004 | Wang | H10D 30/0278 257/E21.426 |
| 2010/0295021 A1* | 11/2010 | Chang | H01L 27/1203 257/E21.409 |
| 2011/0006348 A1 | 1/2011 | Cho et al. | |
| 2011/0086495 A1* | 4/2011 | Pal | H10D 84/0167 438/758 |
| 2011/0280077 A1* | 11/2011 | Fishburn | H10B 41/27 438/257 |
| 2013/0270628 A1* | 10/2013 | Huang | H10D 30/608 257/329 |
| 2016/0099328 A1* | 4/2016 | Huang | B82Y 40/00 257/329 |
| 2016/0268376 A1 | 9/2016 | Shih | |
| 2016/0358835 A1 | 12/2016 | Xie et al. | |
| 2017/0018462 A1 | 1/2017 | Suk et al. | |
| 2017/0154973 A1* | 6/2017 | Ching | H10D 30/6757 |
| 2017/0200738 A1 | 7/2017 | Kim et al. | |
| 2017/0229553 A1 | 8/2017 | Basker et al. | |
| 2017/0278865 A1 | 9/2017 | Ching et al. | |
| 2018/0047853 A1* | 2/2018 | Chang | H01L 29/78696 |
| 2018/0076040 A1* | 3/2018 | Ando | H01L 29/66795 |
| 2018/0240871 A1 | 8/2018 | Cheng et al. | |
| 2019/0115438 A1 | 4/2019 | Ching et al. | |
| 2019/0280107 A1* | 9/2019 | Ando | H01L 29/66439 |
| 2020/0066839 A1* | 2/2020 | Zhang | H01L 21/823412 |
| 2020/0105755 A1* | 4/2020 | Cea | H01L 29/78654 |
| 2020/0152493 A1 | 5/2020 | Colombeau et al. | |
| 2020/0168715 A1 | 5/2020 | Wu et al. | |
| 2020/0243522 A1 | 7/2020 | Cheng et al. | |
| 2020/0279777 A1 | 9/2020 | Zhang et al. | |
| 2021/0296506 A1* | 9/2021 | Wei | H01L 29/785 |
| 2021/0359142 A1* | 11/2021 | Huang | H01L 29/0673 |

FOREIGN PATENT DOCUMENTS

| | | | |
|---|---|---|---|
| TW | I697963 B | 7/2020 | |
| TW | I703642 B | 9/2020 | |
| WO | 2013112702 A1 | 8/2013 | |
| WO | 2017052644 A1 | 3/2017 | |

OTHER PUBLICATIONS

Joo, Sangrae, et al., "Study of Silicon Oxidation in a Remote Plasma-Enhanced Rapid Thermal Processor", Journal of the Korean Physical Society, vol. 51, No. 4, Oct. 2007, pp. 1337-1343.

"PCT International Search Report and Written Opinion in PCT/US2021/054647 dated Feb. 7, 2022, 10 pages".

\* cited by examiner

FORMATION OF GATE ALL AROUND DEVICE

CROSS-REFERENCE TO RELATED APPLICATIONS

This application claims priority to U.S. Provisional Application No. 63/093,829, filed Oct. 20, 2020, and to U.S. Provisional Application No. 63/195,243, filed Jun. 1, 2021, the entire disclosures of which are hereby incorporated by reference herein.

TECHNICAL FIELD

Embodiments of the disclosure generally relate to methods for filling substrate features. More particularly, embodiments of the disclosure are directed to methods for forming high quality I/O oxides.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

Conventional I/O oxide processes result in ex situ pre-clean immediately re-growing poor quality native oxide, ALD type oxide deposition with low density, deposition that linearly decreases the space between nanosheet-nanosheet, limiting down-stream integration (i.e., multi-Vt), and the need for additional post treatment to densify the ALD film, which adds cost and complexity. Accordingly, there is a need for improved methods for forming horizontal gate-all-around devices.

SUMMARY

One or more embodiments of the disclosure are directed to methods of forming a semiconductor device. In one or more embodiments, a method of forming a semiconductor device comprises: pre-cleaning a plurality of nanosheet channel layers, each of the plurality of nanosheet channel layers having a first thickness; forming a conformal sacrificial epitaxial layer on each of the plurality of nanosheet channel layers; pre-cleaning the plurality of nanosheet channel layers with the conformal sacrificial epitaxial silicon layer thereon to remove native oxide and/or residues; and oxidizing the conformal sacrificial epitaxial silicon layer using a plasma to form a silicon oxide layer on the nanosheet, the nanosheet having a second thickness.

Further embodiments of the disclosure are directed to methods of forming a semiconductor device. In one or more embodiments, a method of forming a semiconductor device comprises: pre-cleaning a plurality of nanosheet channel layers, each of the plurality of nanosheet channel layers having a first thickness; forming a conformal sacrificial epitaxial layer on each of the plurality of nanosheet channel layers; annealing the plurality of nanosheet channel layers with the conformal sacrificial epitaxial layer thereon; and oxidizing the conformal sacrificial epitaxial layer using a plasma to form an oxide layer on each of the plurality of nanosheet channel layers, each of the plurality of nanosheet channel layers having a second thickness.

Additional embodiments of the disclosure are directed to horizontal gate-all-around devices. In one or more embodiments, a horizontal gate-all-around device comprises: a plurality of horizontal nanosheet channel layers between a source region and a drain region, each of the plurality of horizontal nanosheet channel layers having a top surface, a bottom surface, and two side surfaces and having a first channel layer thickness in a range of from 2 nm to 15 nm; and an oxide layer on the top surface, bottom surface, and two side surfaces of each of the plurality of horizontal nanosheet channel layers, the oxide layer having an oxide layer thickness in a range of from about 2.5 nm to about 10 nm. The first channel layer thickness is substantially equal to a second channel layer thickness prior to formation of the oxide layer.

Further embodiments of the disclosure are directed to computer readable medium. In one or more embodiments, a non-transitory computer readable medium includes instructions, that, when executed by a controller of a processing chamber, causes the processing chamber to perform the operations of: pre-clean a plurality of nanosheet channel layers, each of the plurality of nanosheet channel layers having a first thickness; form a conformal sacrificial epitaxial layer on each of the plurality of nanosheet channel layers; anneal the plurality of nanosheet channel layers with the conformal sacrificial epitaxial layer thereon; and oxidize the conformal sacrificial epitaxial layer using a plasma to form an oxide layer on each of the plurality of nanosheet channel layers, each of the plurality of nanosheet channel layers having a second thickness.

Additional embodiments of the disclosure are directed to computer readable medium. In one or more embodiments, a non-transitory computer readable medium includes instructions, that, when executed by a controller of a processing chamber, causes the processing chamber to perform the operations of: pre-clean a plurality of nanosheet channel layers, each of the plurality of nanosheet channel layers having a first thickness; form a conformal sacrificial epitaxial layer on each of the plurality of nanosheet channel layers; pre-clean the plurality of nanosheet channel layers with the conformal sacrificial epitaxial silicon layer thereon to remove native oxide and/or residues; and oxidize the conformal sacrificial epitaxial silicon layer using a plasma to form a silicon oxide layer on the nanosheet, the nanosheet having a second thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

In the method of one or more embodiments, gate all-around transistors are fabricated using a standard process flow. After the dummy gate removal, a sacrificial epitaxial layer (e.g., epitaxial silicon layer) is grown conformally on all sides of the silicon nanosheet. In one or more embodiments, the substrate undergoes an optional first pre-clean to remove organic residues. Subsequently, the substrate is subjected to a second pre-clean to remove native oxides, e.g., silicon oxide ($SiO_x$), at the interface of the silicon nano-slab. The substrate is then subjected to conformal radical plasma oxidation (RPO) and spacer treatment. As used here, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. In the method of one or more embodiments, gate all-around transistors are fabricated using a standard process flow. In one or more embodiments, after dummy gate removal, a conformal sacrificial epitaxial layer is grown on the nanosheet, an integrated (in situ) pre-clean is performed to remove the dummy gate oxide. In one or more embodiments, the dummy gate oxide is removed followed by conformal sacrificial epitaxial layer growth without breaking the vacuum. Between epitaxy and pre/clean RP, there may be a vacuum break.

In other embodiments, gate all-around transistors are fabricated using a standard process flow, and, after dummy gate removal, a conformal sacrificial epitaxial layer is grown on the nanosheet, an integrated surface treatment is performed to improve mobility and improve bias temperature instability (BTI). In one or more embodiments, the surface treatment is performed followed by conformal sacrificial epitaxial layer growth without breaking the vacuum. In some embodiments, between epitaxy and surface treatment, there may be a vacuum break.

Figure 1A:
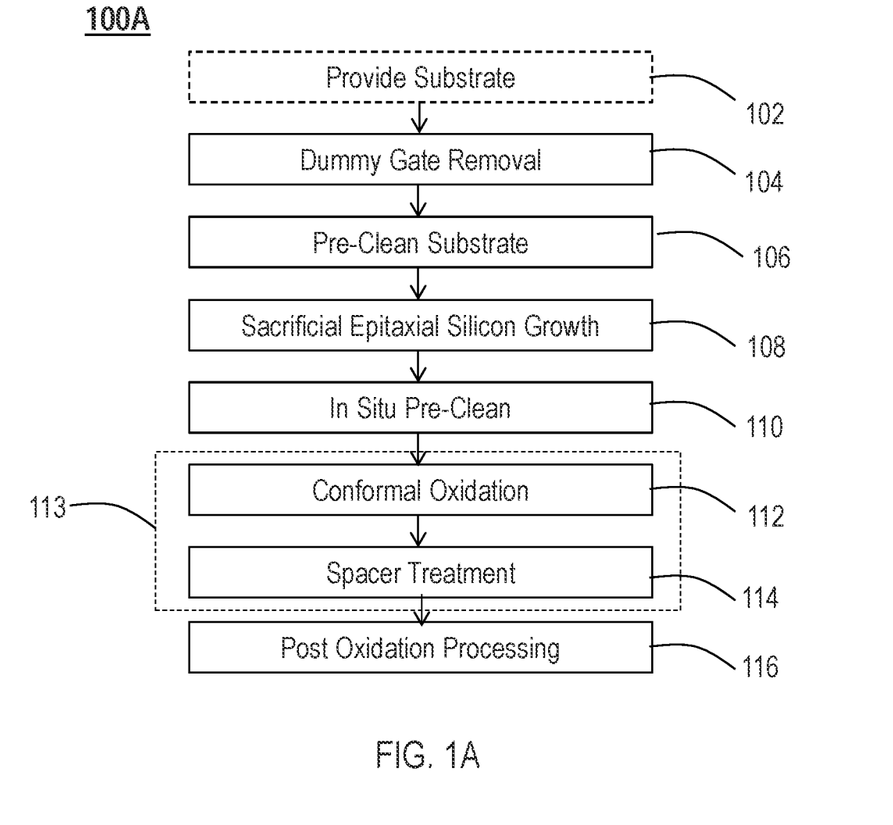
FIG. 1A illustrates a process flow diagram of a method for forming a semiconductor device in accordance with some embodiments of the present disclosure.
Figure 1B:
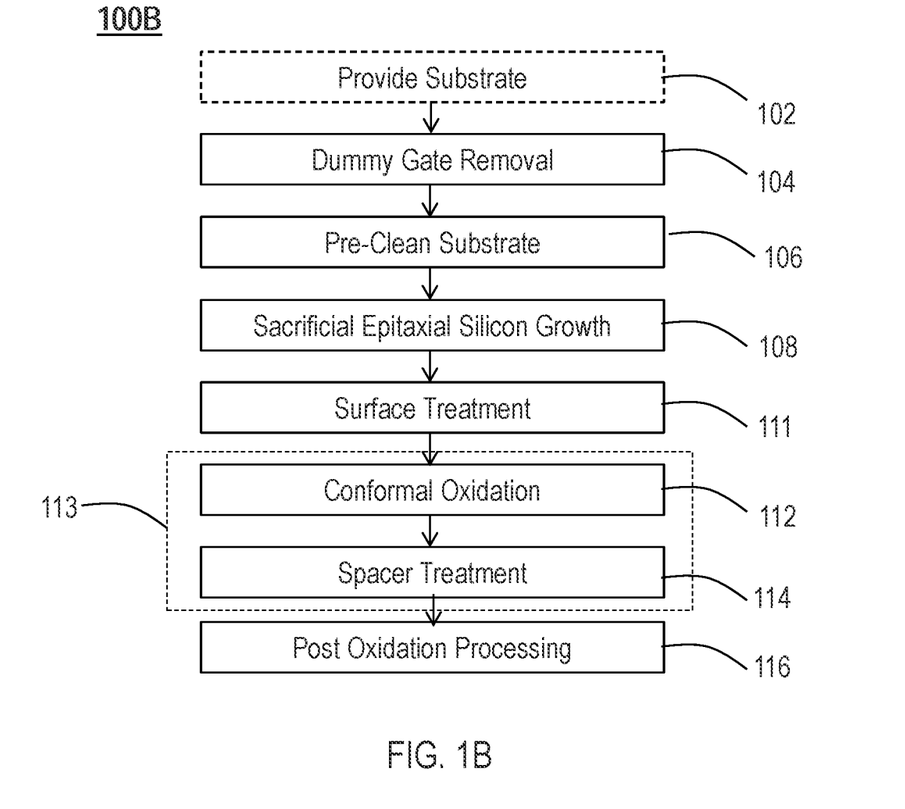
FIG. 1B illustrates a process flow diagram of a method for forming a semiconductor device in accordance with some embodiments of the present disclosure.

FIG. 1A illustrates a process flow diagram for a method 100A for forming a semiconductor device in accordance with some embodiments of the present disclosure. The method 100A is described below with respect to FIGS. 2A-6B, which depict the stages of fabrication of semiconductor structures in accordance with some embodiments of the present disclosure. FIG. 1B illustrates a process flow diagram for a method 100B for forming a semiconductor device in accordance with some embodiments of the present disclosure. The method 100B is described below with respect to FIGS. 2A-6B, which depicts the stages of fabrication of semiconductor structures in accordance with some embodiments of the present disclosure. FIGS. 2A-6B are cross-sectional views of an electronic device (e.g., a hGAA) according to one or more embodiments. The methods 100A and 100B may be part of a multi-step fabrication process of a semiconductor device. Accordingly, the methods 100A and 100B may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figures 2A, 2B:
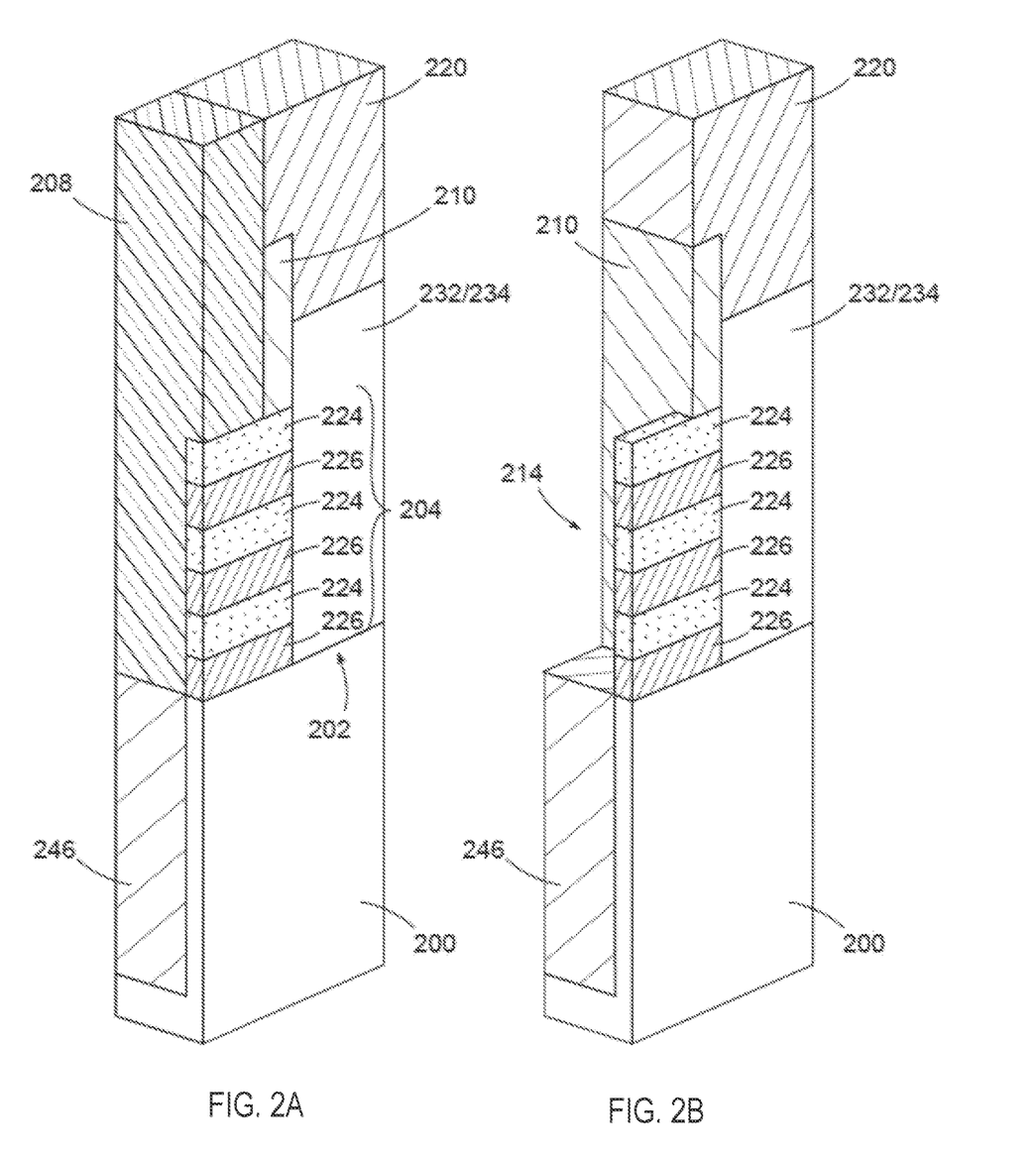
FIG. 2A illustrates a cross-section view of a device according to one or more embodiments.
FIG. 2B illustrates a cross-section view of a device according to one or more embodiments.

The methods 100A and 100B begin, respectively, at operation 102, by providing a substrate 200 having a top surface 202 (as illustrated in FIG. 2A). In some embodiments, the substrate 200 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 200 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 200 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate may be doped to provide a high dose of dopant at a first location of the surface of the substrate 200 in order to prevent parasitic bottom device turn on. In one or more embodiments, a superlattice structure 204 is formed atop the first location. For example, in some embodiments, the surface of the substrate may have a dopant density about $10^{18}$ atoms/cm$^3$ to about $10^{19}$ atoms/cm$^3$.

At least one superlattice structure 204 is formed atop the top surface 202 of the substrate 200 (as depicted in FIG. 2A). The superlattice structure 204 comprises a plurality of semiconductor material layers 226 and a corresponding plurality of nanosheet channel layers 224 alternatingly arranged in a plurality of stacked pairs. In some embodiments the plurality of stacked groups of layers comprises a silicon (Si) and silicon germanium (SiGe) group. In some embodiments, the plurality of semiconductor material layers 226 comprise silicon germanium (SiGe), and the plurality of nanosheet channel layers 224 comprise silicon (Si). In other embodiments, the plurality of nanosheet channel layers 224 comprising silicon germanium (SiGe), and the plurality of semiconductor materials layers comprise silicon (Si).

In some embodiments, the plurality of semiconductor material layers 226 and corresponding plurality of nanosheet channel layers 224 can comprise any number of lattice matched material pairs suitable for forming a superlattice structure 204. In some embodiments, the plurality of semiconductor material layers 226 and corresponding plurality of nanosheet channel layers 224 comprise from about 2 to about 50 pairs of lattice matched materials.

In one or more embodiments, the thickness, $t_1$, of the plurality of semiconductor material layers 226 and the plurality of nanosheet channel layers 224 are in the range of from about 2 nm to about 50 nm, in the range of from about 3 nm to about 20 nm, or in a range of from about 2 nm to about 15 nm.

In some embodiments, a dielectric material 246 is deposited on the substrate 200 using conventional chemical vapor deposition methods. In some embodiments, the dielectric material 246 is recessed below the top surface 202 of the substrate 200 so that the bottom portion of the superlattice structure 204 is formed from the substrate 200.

In some embodiments, a replacement gate structure (e.g., a dummy gate structure 208) is formed over and adjacent to the superlattice structure 204. The dummy gate structure 208 defines the channel region of the transistor device. The dummy gate structure 208 may be formed using any suitable conventional deposition and patterning process known in the art.

In some embodiments, sidewall spacers 210 are formed along outer sidewalls of the dummy gate structure 208. The sidewall spacers 210 of some embodiments comprise suitable insulating materials known in the art, for example, silicon nitride, silicon oxide, silicon oxynitride, silicon carbide, or the like. In some embodiments, the sidewall spacers 210 are formed using any suitable conventional deposition and patterning process known in the art, such as atomic layer deposition, plasma enhanced atomic layer deposition, plasma enhanced chemical vapor deposition or low-pressure chemical vapor deposition.

In some embodiments, the embedded source region 232 and drain region 234 form in a source trench and a drain trench, respectively. In some embodiments, the source region 232 is formed adjacent a first end of the superlattice structure 204 and the drain region 234 is formed adjacent a second, opposing end of the superlattice structure. In the embodiment illustrated in FIG. 2A, one of the source region 232 or drain region 234 is not shown at the front face of the superlattice structure 204. The other end of the superlattice structure 204 has the other of the source region 232 or drain region 234. In some embodiments, the source region 232 and/or drain region 234 are formed from any suitable semiconductor material, such as but not limited to silicon, germanium, silicon germanium, silicon phosphorous, silicon arsenic, or the like. In some embodiments, the source region 232 and drain region 234 may be formed using any suitable deposition process, such as an epitaxial deposition process.

In some embodiments, an inter-layer dielectric (ILD) layer 220 is blanket deposited over the substrate 200, including the source/drain regions 232, 234, the dummy gate structure 208, and the sidewall spacers 210. The ILD layer 220 may be deposited using a conventional chemical vapor deposition method (e.g., plasma enhance chemical vapor deposition and low-pressure chemical vapor deposition). In one or more embodiments, ILD layer 220 is formed from any suitable dielectric material such as, but not limited to, undoped silicon oxide, doped silicon oxide (e.g., BPSG, PSG), silicon nitride, and silicon oxynitride. In one or more embodiments, ILD layer 220 is then polished back using a conventional chemical mechanical planarization method to expose the top of the dummy gate structure 208. In some embodiments, the ILD layer 220 is polished to expose the top of the dummy gate structure 208 and the top of the sidewall spacers 210.

In operation 104, as shown in FIG. 2B, the dummy gate structure 208 is removed to expose the channel region 214 of the superlattice structure 204. The ILD layer 220 protects the source/drain regions 232, 234 during the removal of the dummy gate structure 208. The dummy gate structure 208 may be removed using any conventional etching method such as a plasma dry etch or a wet etch. In some embodiments, the dummy gate structure 208 comprises poly-silicon and the dummy gate structure 208 is removed by a selective etch process. In some embodiments, the dummy gate structure 208 comprises poly-silicon and the superlattice structure 204 comprises alternating layers of silicon (Si) and silicon germanium (SiGe).

Figure 2C:
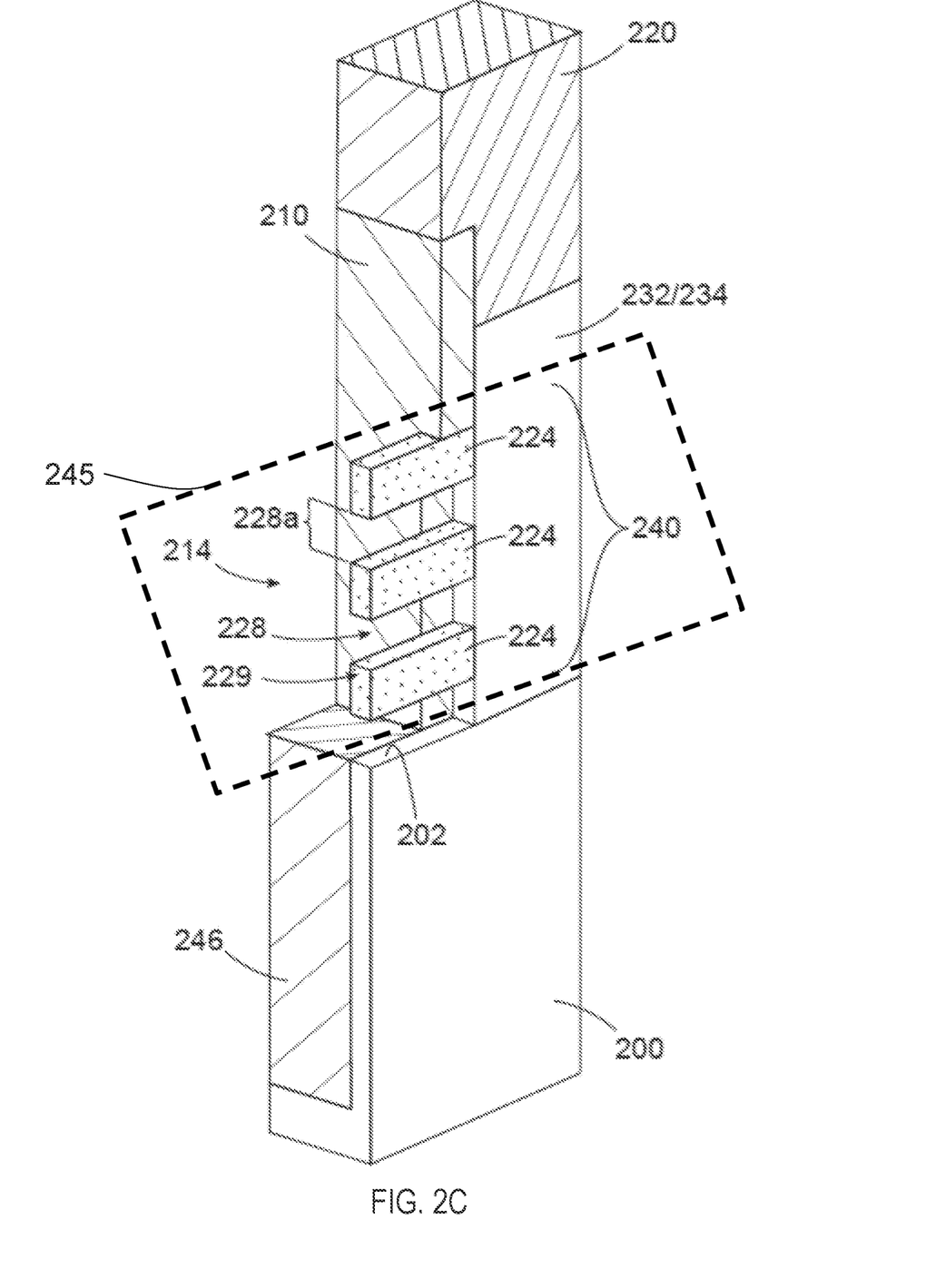
FIG. 2C illustrates a cross-section view of a device according to one or more embodiments.

In operation 106, as shown in FIG. 2C, the plurality of semiconductor material layers 226 are selectively etched between the plurality of nanosheet channel layers 224 in the superlattice structure 204. For example, where the superlattice structure 204 is composed of silicon (Si) layers and silicon germanium (SiGe) layers, the silicon germanium (SiGe) is selectively etched to form channel nanowires 240. The plurality of semiconductor material layers 226, for example silicon germanium (SiGe), may be removed using any well-known etchant that is selective to the plurality of nanosheet channel layers 224 where the etchant etches the plurality of semiconductor material layers 226 at a significantly higher rate than the plurality of nanosheet channel layers 224. In some embodiments, a selective dry etch or wet etch process may be used. In some embodiments, where the plurality of nanosheet channel layers 224 are silicon (Si) and the plurality of semiconductor material layers 226 are silicon germanium (SiGe), the layers of silicon germanium may be selectively removed using a wet etchant such as, but not limited to aqueous carboxylic acid/nitric acid/HF solution and aqueous citric acid/nitric acid/HF solution. The removal of the plurality of semiconductor material layers 226 leaves voids 228 between the plurality of nanosheet channel layers 224. The voids 228 between the plurality of nanosheet channel layers 224 have a thickness of about 3 nm to about 20 nm. The remaining nanosheet channel layers 224 form a vertical array of channel nanowires 240 that are coupled to the source/drain regions 232, 234. The channel nanowires 240 run parallel to the top surface 202 of the substrate 200 and are aligned with each other to form a single column of channel nanowires 240. The formation of the source region 232 and drain region 234 and the formation of an optional lateral etch stop layer advantageously provide self-alignment and structural integrity in the formation of the channel structure.

In some embodiments, after dummy gate removal, an integrated (in situ) pre-clean is performed. The device is in situ pre-cleaned to remove any oxide on the gate. The pre-clean can remove native oxide present on a surface of the gate. In pre-clean process may include a dry etch process, a wet etch process, or a combination of both.

The isotropic etch process of operation 106 may include any suitable etch process that is selective to the semiconductor material of the plurality of nanosheet channel layers 224. In some embodiments the isotropic etch process of operation 106 comprises one or more of a wet etch process or a dry etch process. In some embodiments, the isotropic etch process of operation 106 comprises a dry etch process.

In such embodiments, the dry etch process may include a conventional plasma etch, or a remote plasma-assisted dry etch process, such as a SiCoNi™ etch process, available from Applied Materials, Inc., located in Santa Clara, Calif. In a SiCoNi™ etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The SiCoNi™ etch process may be performed in a SiCoNi™ Preclean chamber, which may be integrated into one of a variety of multi-processing platforms, including the Centura®, Dual ACP, Producer® GT, and Endura® platform, available from Applied Materials®. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Figure 2D:
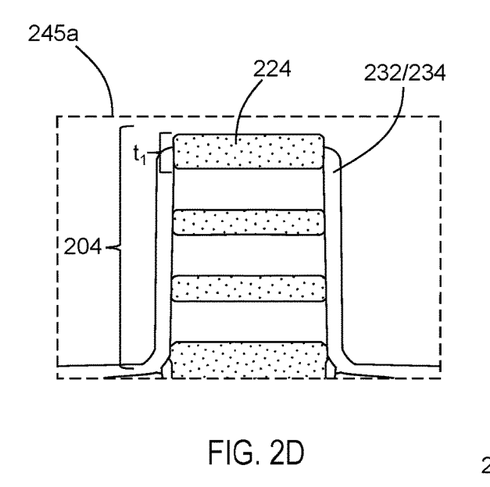
FIG. 2D illustrates an enlarged cross-section view of a device according to one or more embodiments.
Figure 2E:
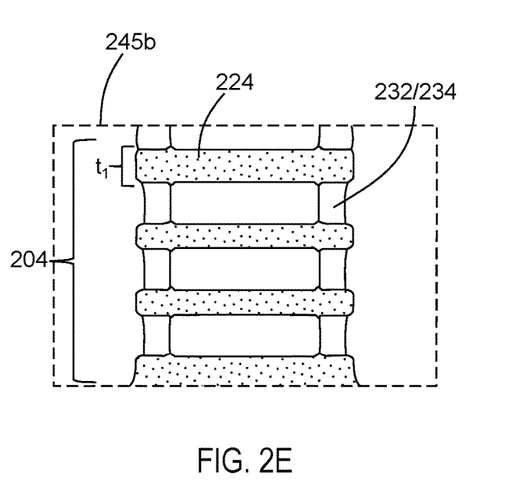
FIG. 2E illustrates an enlarged cross-section view of a device according to one or more embodiments.

Referring to FIGS. 2D and 2E, which are enlarged cross-sectional views 245a, 245b of the substrate of FIG. 2C, in one or more embodiments, the thicknesses, $t^1$, of the plurality of nanosheet channel layers 224 are in the range of from about 2 nm to about 50 nm, in the range of from about 3 nm to about 20 nm, or in a range of from about 2 nm to about 15 nm. The plurality of nanosheet channel layers 224 extend between the source/drain regions 232/234.

Figure 3A:
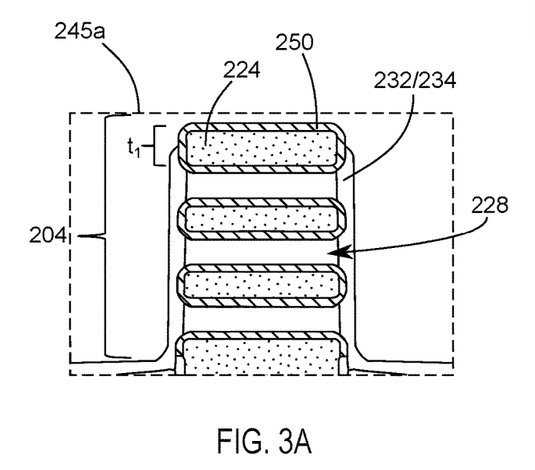
FIG. 3A illustrates an enlarged cross-section view of a device according to one or more embodiments.
Figure 3B:
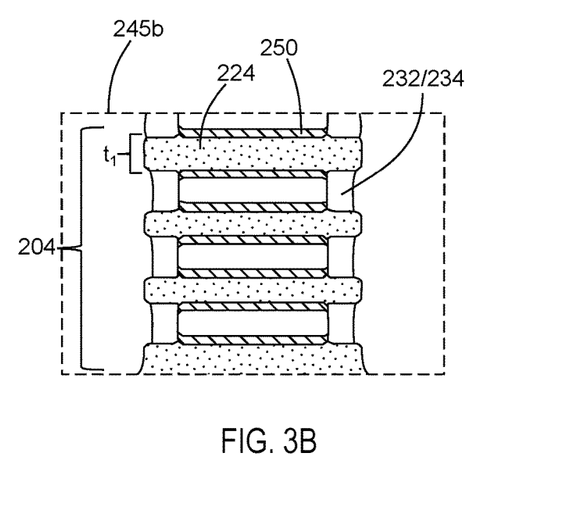
FIG. 3B illustrates an enlarged cross-section view of a device according to one or more embodiments.

Referring to FIGS. 3A and 3B, in operation 108, a sacrificial epitaxial layer 250 is grown or formed conformally on the plurality of nanosheet channel layers 224. In some embodiments, the conformal sacrificial epitaxial layer 250 comprises silicon (Si). an epitaxial regrowth process on each of the plurality of nanosheet channel layers 224 through the voids 228. The epitaxial regrowth process of some embodiments is a selective epitaxy process. In some embodiments, the selective epitaxy process epitaxially grows the sacrificial epitaxial layer 250 through the voids 228 (also referred to as trenches). The epitaxial growth of some embodiments causes the sacrificial epitaxial layer 250 to merge into a contact of the nanosheet channel layers 224. In some embodiments, the plurality of nanosheet channel layers 224 comprise silicon and the epitaxy causes the nanosheet channel layers 224 to merge and pinch off the voids 228. In some embodiments, the epitaxy process causes growth of Si <100>. In some embodiments, the epitaxy process causes growth of Si <110>. In some embodiments, the epitaxy process causes the contacts to have a conical shape, flat topped, or a frustoconical shape.

In some embodiments, the epitaxial regrowth of operation 108 is conducted at a lower temperature than traditional epitaxial processes. In one or more embodiments, the epitaxial regrowth is conducted at a temperature in a range of from 500° C. to 900° C., or from 500° C. to 800° C., or from 500° C. to 750° C., or from 500° C. to 720° C. In one or more embodiments, the epitaxial regrowth is conducted at a pressure in a range of from 5 Torr to 20 Torr.

In one or more embodiments, the sacrificial epitaxial layer 250 comprises epitaxially grown silicon (Si). In some embodiments, the thickness of the sacrificial epitaxial layer 250 is in a range of from about 0.5 nm to about 2.5 nm, or in a range of from about 1.2 nm to about 2.5 nm, or in a range of from about 1.5 nm to about 2.5 nm.

Referring to FIG. 1A, in the method 100A, at operation 110, the device is in situ pre-cleaned to remove any oxide on the sacrificial epitaxy. The pre-clean can remove native oxide present on a surface of the sacrificial epitaxy. The pre-clean process may include a dry etch process, a wet etch process, or a combination of both. In some embodiments, operations 104 and 106 are integrated such that there is no vacuum break. In some embodiments, operations 110 and 112 are integrated such that there is no vacuum break.

In some embodiments, the apparatus or process tool is configured to maintain the substrate under vacuum conditions to prevent formation of an oxide layer after the pre-trimming cleaning process of operation 110. In embodiments of this sort, the process tool is configured to move the substrate from a pre-cleaning chamber to an etch process chamber without exposing the substrate to atmospheric conditions.

Referring to FIG. 1B, in one or more alternative embodiments, at operation 111 of the method 100B, the device undergoes a surface treatment to improve mobility and bias temperature instability (BTI). In one or more embodiments, the surface treatment includes annealing in an atmosphere of hydrogen ($H_2$). The anneal may be any suitable anneal process known to the skilled artisan. In some embodiments, the annealing is a rapid thermal process (RTP) anneal. In some embodiments, the anneal is conducted at a temperature in a range of from 500° C. to 900° C., or in a range of from 600° C. to 900° C., or in a range of from 600° C. to 800° C. In some embodiments, the anneal is conducted at a pressure in a range of from 5 Torr to 20 Torr.

In some embodiments, operations 104 and 106 are integrated such that there is no vacuum break. In some embodiments, operations 111 and 112 are integrated such that there is no vacuum break.

In some embodiments, the apparatus or process tool is configured to maintain the substrate under vacuum conditions to prevent formation of an oxide layer after the surface treatment at operation 111. In embodiments of this sort, the process tool is configured to move the substrate from a surface treatment chamber (e.g., an annealing chamber) to a plasma oxidation chamber for operation 112 without exposing the substrate to atmospheric conditions.

Figure 4A:
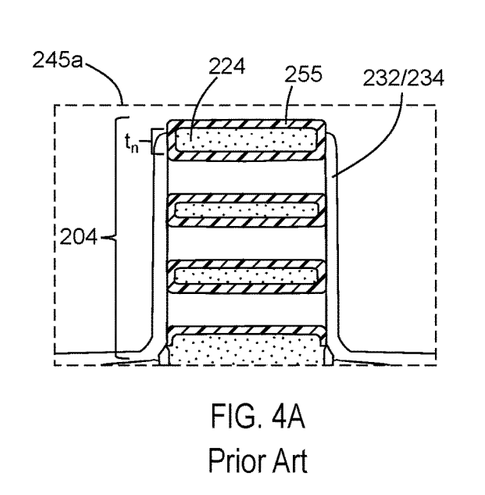
FIG. 4A illustrates an enlarged cross-section view of a device according to the prior art.
Figure 4B:
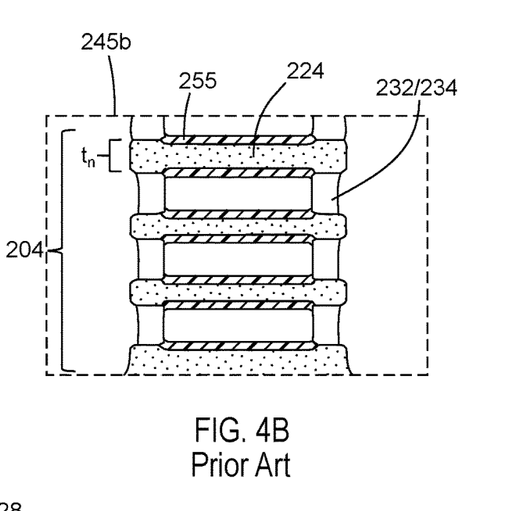
FIG. 4B illustrates an enlarged cross-section view of a device according to the prior art.

With reference to FIGS. 4A and 4B, in processes according to the prior art, direct radical plasma oxidation (RPO) of the devices to form oxide layer 255, results in consumption of the silicon nanosheets, i.e., the plurality of nanosheet channel layers 224. Thus, according to the prior art, the thickness, tn, of the plurality of nanosheet channel layers 224, after RPO is less than the thickness, $t_1$, of the plurality of nanosheet channel layers 224 prior to RPO.

Figure 5A:
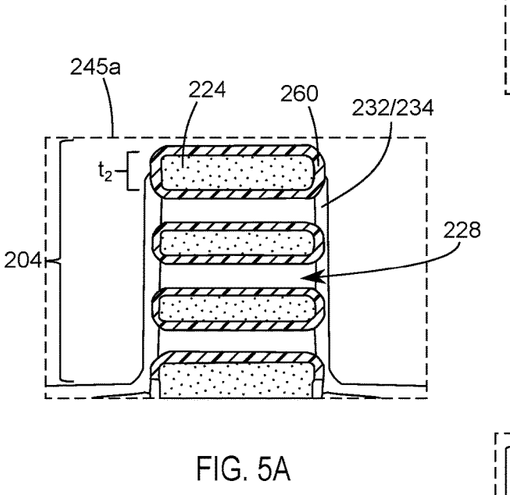
FIG. 5A illustrates an enlarged cross-section view of a device according to one or more embodiments.
Figure 5B:
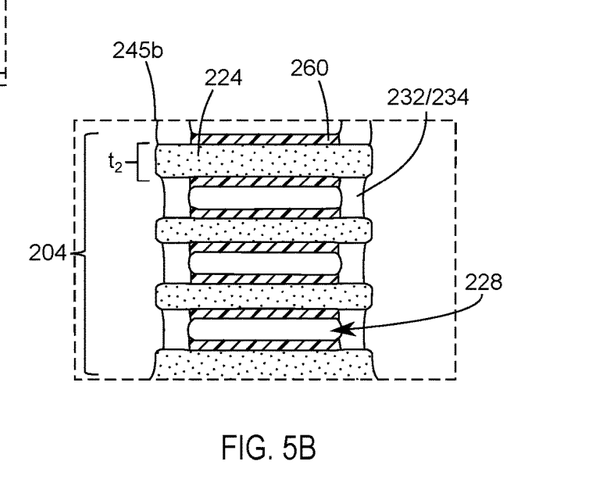
FIG. 5B illustrates an enlarged cross-section view of a device according to one or more embodiments.

Referring to FIGS. 5A and 5B, in one or more embodiments, at operation 112, an oxide layer 260 is formed on the plurality of nanosheet channel layers 224. In one or more embodiments, the oxide layer 260 is formed by radical plasma oxidation (RPO) of the sacrificial epitaxial layer 250 at a temperature in a range of from about 700° C. to about 900° C. in an atmosphere of hydrogen ($H_2$) gas and oxygen ($O_2$) gas at ambient pressure. The oxide layer 260 may comprise any suitable material known to the skilled artisan. In one or more embodiments, the oxide layer 260 comprises silicon oxide ($SiO_x$). In one or more embodiments, the sacrificial epitaxial layer 250 comprises silicon (Si), and the oxide layer 260 comprises silicon oxide ($SiO_x$).

FIG. 5A is a schematic of how the oxide layer 260 grows on the plurality of nanosheet channel layers 224. In one or more embodiments, the oxide layer 260 grows (or forms) conformally on the surface of the plurality of nanosheet channel layers 224. The oxide layer 260 is dense because the sacrificial epitaxial layer 250 is directly oxidized. The oxidation consumes the sacrificial epitaxial layer 250 while advantageously not consuming the nanosheet channel layers 224. In one or more embodiments, the sacrificial epitaxial layer 250 comprises silicon (Si), and the oxide layer 260 comprises silicon oxide ($SiO_x$), and the ratio of the silicon oxide ($SiO_x$) to silicon (Si) is about 3:1.

In one or more embodiments, after the RPO oxidation, the plurality of nanosheet channel layers 224 have a second thickness, $t_2$. In one or more embodiments, the second thickness, $t_2$, of the plurality of nanosheet channel layers 224 are in a range of from about 2 nm to about 50 nm, in a range of from about 3 nm to about 20 nm, in a range of from about 2 nm to about 15 nm, in a range of from 2.5 nm to 10 nm, in a range of from 4 nm to 8 nm, or in a range of from 2.5 nm to 7.5 nm. In one or more embodiments, the second thickness, $t_2$, is equal to first thickness, $t_1$, indicating that none of the underlying nanosheet channel layers 224 is consumed during the RPO oxidation.

In one or more embodiments, the second thickness, $t_2$, is substantially equal to first thickness, $t_1$, indicating that none of the underlying nanosheet channel layers 224 is consumed during the RPO oxidation. As used herein, the term "substantially equal" means that the second thickness is within ±0.5 nm, ±0.4 nm, ±0.3 nm, ±0.2 nm or ±0.1 nm of the first thickness.

In one or more embodiments, the sacrificial epitaxial layer 250 protects the nanosheet channel layers 224 from oxidation, thus allowing the distance between the nanosheet channel layers 224, to be adjusted while sustaining the device performance.

In other embodiments, the first thickness, $t_1$, is greater than the second thickness $t_2$, indicating that a portion of the underlying nanosheet channel layers 224 is consumed during the RPO oxidation. In one or more embodiments, about 0.5 nm to about 1.5 nm of the underlying nanosheet channel layers 224 is consumed during the RPO oxidation.

In addition to the oxidation consuming the sacrificial epitaxial layer 250, at operation 114, the spacer 210 is partially oxidized, driving down the dielectric constant, k-value, of the spacer 210. In some embodiments, the operation 112 and operation 114 occur simultaneously in a single operation 113.

Figure 6A:
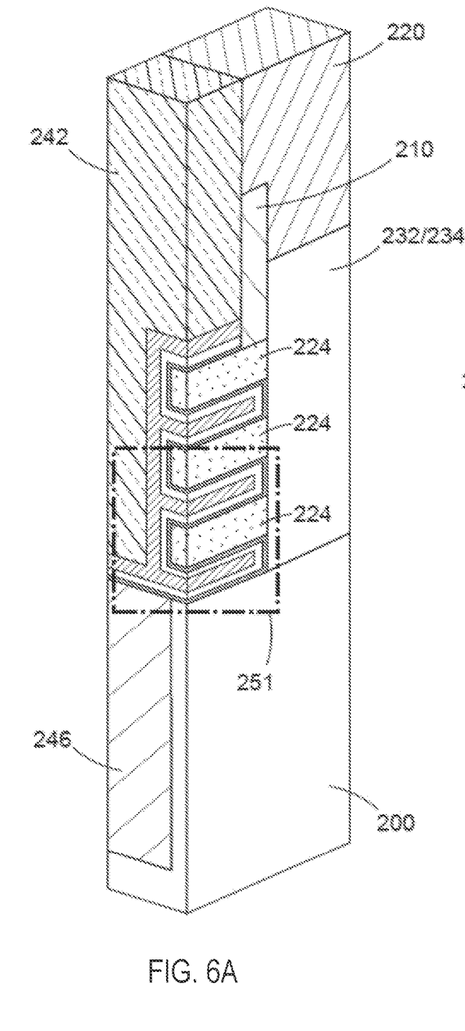
FIG. 6A illustrates a cross-section view of a device according to one or more embodiments.
Figure 6B:
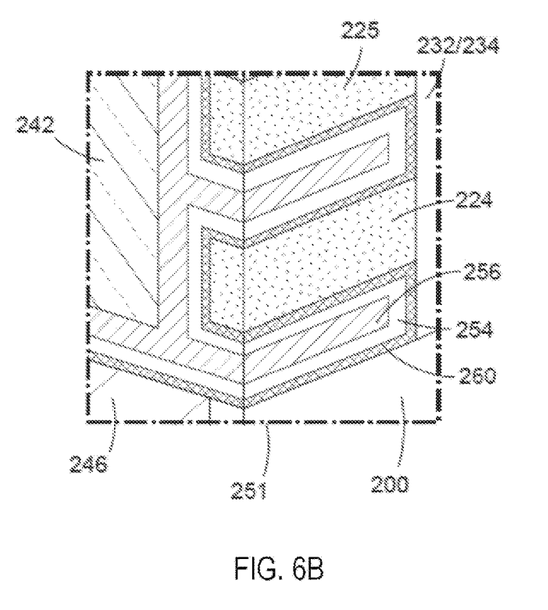
FIG. 6B illustrates an enlarged cross-section view of the device of FIG. 6A according to one or more embodiments.

In one or more embodiments, operation 116 of method 100 represents one or more post-oxidation processing operations. The one or more post-oxidation processes can by any of the processes known to the skilled artisan for completion of the hGAA device. Referring to FIGS. 6A and 6B, a high-k dielectric layer 254 is formed on the oxide layer 260. The high-k dielectric layer 254 can be any suitable high-k dielectric material deposited by any suitable deposition technique known to the skilled artisan. The high-k dielectric layer 254 of some embodiments comprises hafnium oxide. In some embodiments, a conductive material 256 such as titanium nitride (TiN), tungsten (W), cobalt (Co), aluminum (Al), or the like is deposited on the high-k dielectric layer 254. The conductive material 256 may be formed using any suitable deposition process such as, but not limited to, atomic layer deposition (ALD) in order to ensure the formation of a layer having a uniform thickness around each of the nanosheet channel layers 224.

In some embodiments, a gate electrode 242 is formed on the substrate 200 and surrounds each of the nanosheet channel layers 224. The gate electrode 242 may be formed from any suitable gate electrode material known in the art. The gate electrode material is deposited using any suitable deposition process such as atomic layer deposition (ALD) to ensure that gate electrode 242 is formed around and between each of the nanosheet channel layers 224. In one or more embodiments, the gate electrode is deposited by CVD because there is limited space available between the nanosheets for the gate electrode to fit. The resultant device formed using the method described herein is a horizontal gate all around device, in accordance with an embodiment of the present disclosure. Some embodiments of the disclosure are directed to horizontal gate-all-around devices comprising a channel layer made by a nanosheet in the channel between source and drain regions (i.e., a nanosheet channel layer 224).

One or more embodiments of the disclosure are directed to methods of forming a semiconductor device. In one or more embodiments, a method of forming a semiconductor device, comprises: selectively etching a superlattice structure comprising a plurality of semiconductor material layers and a corresponding plurality of nanosheet channel layers alternatingly arranged in a plurality of stacked pairs to remove each of the semiconductor material layers to form a plurality of voids in the superlattice structure and a plurality of semiconductor material layers extending between a source region and a drain region; growing a conformal sacrificial epitaxial layer on the plurality of nanosheet channel layers, each of the plurality of nanosheet channel layers having a first thickness; annealing the plurality of nanosheet channel layers having the conformal sacrificial epitaxial layer thereon; and oxidizing the conformal sacrificial epitaxial layer using a plasma to form an oxide layer (e.g., silicon oxide) on each of the plurality of nanosheet channel layers, each of the plurality of nanosheet channel layers having a second thickness.

One or more embodiments are directed to a horizontal gate all around device. The final GAA device of one or more embodiments always has discrete channels separated from one another running from the source to the drain. In one or more embodiments, the gate materials wrap completely around the discrete channels on all sides. This is unlike traditional GAA devices, where the finFET has only three sides covered. In one or more embodiments, the hGAA device comprises a plurality of horizontal nanosheet channel layers between a source region and a drain region, the plurality of horizontal nanosheet channel layers having a top surface, a bottom surface, and two side surfaces; and an oxide layer on the top surface, bottom surface, and two side surfaces of the plurality of horizontal nanosheet channel layers. In one or more embodiments, the oxide layer has a thickness in a range of from about 4 nm to about 8 nm, which is equal to the thickness of the epitaxial layer from which it was produced. In other embodiments, the oxide layer has a thickness in a range of from about 2.5 nm to 7.5 nm. In some embodiments, the oxide layer comprises silicon oxide. In some embodiments, the plurality of horizontal channel layers comprise silicon (Si). In some embodiments, the plurality of horizontal channel layers have not been consumed during oxidation to form the oxide layer. Thus, in one or more embodiments, each of the plurality of horizontal channel layers have a thickness that is substantially equal to the thickness of each of the plurality of horizontal channel layers prior to forming the oxide layer. As used herein the term "substantially equal" means that the thickness of each of the horizontal channel layers in the final device is within ±0.5 nm, ±0.4 nm, ±0.3 nm, ±0.2, nm or ±0.1 nm of each of the horizontal channel layers prior to oxidizing the device.

Figure 7:
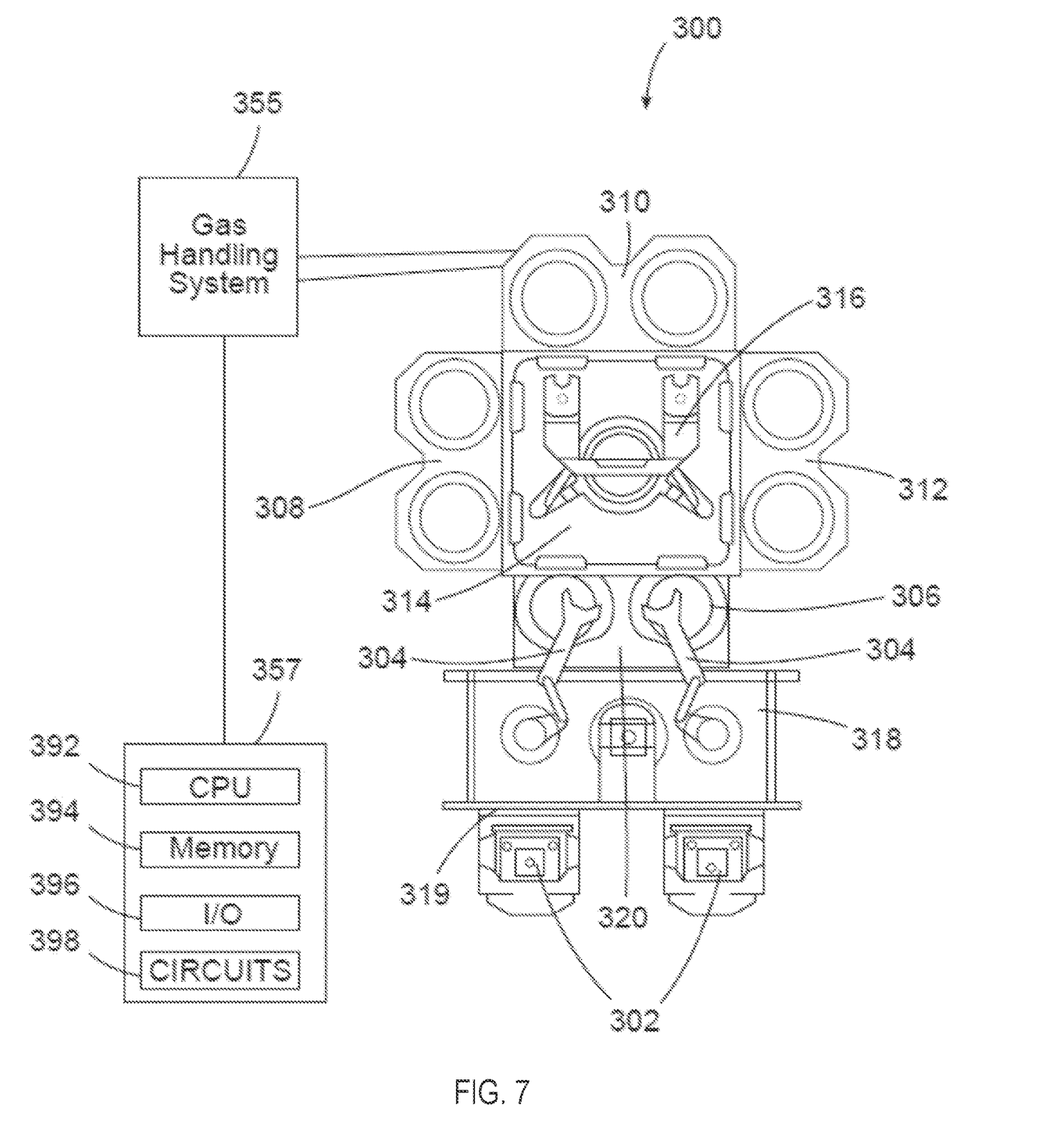
FIG. 7 illustrates a cluster tool according to one or more embodiments.

Additional embodiments of the disclosure are directed to processing tools 300 for the formation of the GAA devices and methods described, as shown in FIG. 7. A variety of multi-processing platforms, including the Centura®, Dual ACP, Producer® GT, and Endura® platform, available from Applied Materials® as well as other processing systems may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a pre-clean chamber, a deposition chamber, an annealing chamber, an etching chamber, a selective etching chamber, and the like. The particular arrangement of process chambers and components can be varied depending on the cluster tool and should not be taken as limiting the scope of the disclosure.

In some embodiments, the cluster tool 300 includes an epitaxial growth chamber for growing the conformal epitaxial layer 250 and a radical plasma oxidation chamber for radical plasma oxidation (RPO) of the conformal epitaxial layer 250 to form the oxide layer 260. In some embodiments, the cluster tool 300 includes a pre-cleaning chamber connected to the central transfer station. In other embodiments, the cluster tool 300 includes an annealing chamber connected to the central transfer station. In still further embodiments, the cluster tool 300 includes both a pre-cleaning chamber and an annealing chamber connected to the central transfer station.

In the embodiment shown in FIG. 7, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the epitaxial growth chamber to grow a conformal sacrificial epitaxial layer 250 on a nanosheet channel layer 224.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising an epitaxial growth chamber and a radical plasma oxidation (RPO) chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:
   a first pre-cleaning process, comprising pre-cleaning a plurality of nanosheet channel layers, each of the plurality of nanosheet channel layers having a first thickness;
   forming a conformal sacrificial epitaxial silicon layer consisting essentially of epitaxial silicon on each of the plurality of nanosheet channel layers;
   a second pre-cleaning process, comprising pre-cleaning the plurality of nanosheet channel layers with the conformal sacrificial epitaxial silicon layer thereon to remove native oxide and/or residues; and
   oxidizing the conformal sacrificial epitaxial silicon layer using a plasma to form a silicon oxide layer consisting essentially of silicon oxide on each of the plurality of nanosheet channel layers, each of the plurality of nanosheet channel layers having a second thickness, wherein the first thickness and the second thickness are substantially equal.

2. The method of claim 1, wherein the conformal sacrificial epitaxial silicon layer has a thickness in a range of from about 0.5 nm to about 2.5 nm.

3. The method of claim 1, wherein the first thickness is in a range of from about 4 nm to about 8 nm.

4. The method of claim 1, wherein the second thickness is in a range of from about 4 nm to about 8 nm.

5. The method of claim 1, wherein the second thickness is in a range of from about 2.5 nm to about 7.5 nm.

6. The method of claim 1, further comprising, prior to the second pre-cleaning process, selectively etching a superlattice structure comprising the plurality of nanosheet channel layers and a corresponding plurality of semiconductor material layers alternatingly arranged in a plurality of stacked pairs to remove each of the plurality of semiconductor material layers to form a plurality of voids in the superlattice structure, the plurality of semiconductor material layers extending between a source region and a drain region.

7. The method of claim 6, further comprising forming the source region adjacent a first end of the superlattice structure and the drain region adjacent a second opposing end of the superlattice structure.

8. The method of claim 6, wherein the superlattice structure is formed on a top surface of a substrate.

9. The method of claim 7, wherein the plurality of semiconductor material layers comprise silicon germanium (SiGe) and the plurality of nanosheet channel layers comprise silicon (Si).

10. The method of claim 6, wherein the plurality of semiconductor material layers comprise silicon (Si) and the plurality of nanosheet channel layers comprise silicon germanium (SiGe).

11. The method of claim 1, wherein forming the conformal sacrificial epitaxial silicon layer comprises epitaxially growing the conformal sacrificial epitaxial silicon layer at a temperature in a range of from 500° C. to 800° C.

12. The method of claim 1, wherein the method is performed in a processing chamber without breaking vacuum.

13. The method of claim 1, wherein pre-cleaning the plurality of nanosheet channel layers comprises one or more of a dry etch process and a wet etch process.

14. The method of claim 1, wherein oxidizing the conformal sacrificial epitaxial silicon layer comprises radical plasma oxidation (RPO) of the conformal sacrificial epitaxial silicon layer at a temperature in a range of from about 500° C. to about 900° C. in an atmosphere of hydrogen ($H_2$) gas and oxygen ($O_2$) gas at ambient pressure.

15. The method of claim 1, further comprising:
forming a high-k dielectric layer on the oxide layer; and
forming a conductive layer on the high-k dielectric layer.

16. A method of forming a semiconductor device, the method comprising:
a first pre-cleaning process, comprising pre-cleaning a plurality of nanosheet channel layers, each of the plurality of nanosheet channel layers having a first thickness;
forming a conformal sacrificial epitaxial silicon layer consisting essentially of epitaxial silicon on each of the plurality of nanosheet channel layers;
annealing the plurality of nanosheet channel layers with the conformal sacrificial epitaxial silicon layer thereon; and
oxidizing the conformal sacrificial epitaxial silicon layer using a plasma to form an oxide layer consisting essentially of silicon oxide on each of the plurality of nanosheet channel layers, each of the plurality of nanosheet channel layers having a second thickness, wherein the first thickness and the second thickness are substantially equal.

17. The method of claim 16, wherein the conformal sacrificial epitaxial silicon layer has a thickness in a range of from 0.5 nm to 2.5 nm.

18. The method of claim 16, wherein the first thickness is in a range of from 4 nm to 8 nm.

19. The method of claim 16, wherein the second thickness is in a range of from 2.5 nm to 10 nm.

20. The method of claim 16, further comprising, prior to the second pre-cleaning process, selectively etching a superlattice structure comprising the plurality of nanosheet channel layers and a corresponding plurality of semiconductor material layers alternatingly arranged in a plurality of stacked pairs to remove each of the plurality of semiconductor material layers to form a plurality of voids in the superlattice structure, the plurality of semiconductor material layers extending between a source region and a drain region.

21. The method of claim 20, further comprising forming the source region adjacent a first end of the superlattice structure and the drain region adjacent a second opposing end of the superlattice structure.

22. The method of claim 20, further comprising forming the superlattice structure on a top surface of a substrate.

23. The method of claim 20, wherein the plurality of semiconductor material layers comprise silicon germanium (SiGe) and the plurality of nanosheet channel layers comprise silicon (Si).

24. The method of claim 20, wherein the plurality of semiconductor material layers comprise silicon (Si) and the plurality of nanosheet channel layers comprise silicon germanium (SiGe).

25. The method of claim 16, wherein forming the conformal sacrificial epitaxial silicon layer comprises epitaxially growing the conformal sacrificial epitaxial silicon layer at a temperature in a range of from 500° C. to 800° C.

26. The method of claim 16, wherein the method is performed in a processing chamber without breaking vacuum.

27. The method of claim 16, wherein pre-cleaning the plurality of nanosheet channel layers comprises one or more of a dry etch process and a wet etch process.

28. The method of claim 16, wherein oxidizing the conformal sacrificial epitaxial silicon layer comprises radical plasma oxidation (RPO) of the conformal sacrificial epitaxial silicon layer at a temperature in a range of from about 500° C. to about 900° C. in an atmosphere of hydrogen ($H_2$) gas and oxygen ($O_2$) gas at ambient pressure.

29. The method of claim 16, wherein the plurality of nanosheet channel layers are annealed at a temperature in a range of from 600° C. to 900° C. at a pressure in a range of from 5 Torr to 20 Torr in an atmosphere comprising hydrogen ($H_2$).

30. The method of claim 16, further comprising:
forming a high-k dielectric layer on the oxide layer; and
forming a conductive layer on the high-k dielectric layer.

* * * * *